United States Patent [19]
Jackson

[11] Patent Number: 5,036,160
[45] Date of Patent: Jul. 30, 1991

[54] TWISTED PAIR BACKPLANE

[75] Inventor: Joseph M. Jackson, Cupertino, Calif.

[73] Assignee: Crosspoint Systems, Inc., Mountain View, Calif.

[21] Appl. No.: 432,472

[22] Filed: Nov. 7, 1989

[51] Int. Cl.$^5$ .................. H05K 1/02; H01B 11/08
[52] U.S. Cl. .................................... 174/33; 174/262; 333/1; 333/12; 333/238
[58] Field of Search ............... 174/32, 33, 34, 251, 174/262; 333/1, 12, 161, 238, 246

[56] References Cited
U.S. PATENT DOCUMENTS
3,757,028  9/1973  Schiessel .................. 174/34 X Primary Examiner—Laramie E. Askin
Attorney, Agent, or Firm—Flehr, Hohbach, Test, Albritton & Herbert

[57] ABSTRACT

A backplane having a layer of insulation material, a plurality of lead segments arranged in line and spaced from one another on a first surface of the insulation material, a plurality of cooperating lead segments arranged in line and spaced from one another on a second surface of the insulation material, and connectors for interconnecting the ends of alternate segments on the first and second surfaces to form a first continuous line alternating between lead segments on the first and second surfaces. Connectors are also provided for connecting the ends of alternate segments on the first and second surfaces to form a second continuous line separate from the first line, the first and second lines twisting along the axis of signal propagation to produce a twisted pair in the backplane.

6 Claims, 4 Drawing Sheets

TWISTED PAIR BACKPLANE

The present invention relates to backplanes. More specifically, the present invention relates to a twisted pair backplane arrangement which also provides coaxial protection.

BACKGROUND OF THE INVENTION

Referring to FIGS. 1a and 1b, a typical backplane and card arrangement of the prior art is shown. In the arrangement 10, a plurality of electrical circuit cards 12 are mounted on a backplane 14 and interconnected to leads in the backplane 14 through a plurality of slots 26. The backplane 14 may comprise a multi-layer printed circuit. Often in this and similar arrangements several data lines and/or control lines are common to two or more cards 12. For instance, there may be an input/output card 16, a processor card 18, a memory card 20 and some type of data manipulation card 22 all sharing common data lines. The data lines 24 are shown interconnecting the various cards 12.

In this arrangement, signals may be sent back and forth between cards 12 on the data lines 24. The signals transmitted on these data lines 24 are transmitted at high speeds. In addition to data lines 24, several other signals may traverse the backplane 14 at any given instance of time. To maximize the use of backplane space, data and control lines are located in close proximity to one another.

Two common problems associated with the transmission of electrical signals in lines that are located in close proximity to one another are shielding and cross talk. Both of these phenomena are well known in the art. Shielding refers to establishing a ground plane around a signal line to insulate it from outside influences, e.g., coaxial cable. Cross talk refers to the occasion when a signal in one line interferes with a signal in another adjacent transmission line through inductive coupling.

High speed high frequency signal transmission makes possible the transmission of electrical signals at rates in the MegaHertz frequency transmission range. However, these high frequency signals accentuate the problems.

To provide some form of shielding protection and to provide a common ground, a backplane 14 is configured with a common ground plane. The ground plane may either be internal or external to the backplane 14 or both. Usually it is external, thereby offering some shielding to the backplane as a whole. A significant problem with this arrangement is that it does not provide shielding between leads or wires in the backplane, but rather protects the backplane as a whole from external signals.

Turning now to crosstalk, the phenomenon of inductive cross talk is well known in the data communications industry, particularly with respect to telephones. Cross talk on open-wire carrier facilities (e.g., telephone poles) results from the inductive couplings which exists between parallel wire pairs. This cross talk can be reduced to tolerable dimensions by a method of line treatment known as transposing in which the positions of the wires of each pair are interchanged (transposed) at intervals along the length of the facility.

Since, in the telephone scenario, it is practically impossible to space each wire of a pair equally distant from all disturbing conductors, the next best thing is to arrange the wires so that they "take turns" in sharing positions nearer and farther from disturbing conductors. This is done by transposing the wires systematically. Transpositions must be designed to cancel crosstalk locally, rather than around the whole circuit, so that phase shifts won't partially or completely cancel the effect of the transpositions. A common way of achieving this result in phone lines is twisting the individual lines and their return lines in bundles which are further twisted circularly about themselves.

This twisting of signal pairs, however, has not been utilized in backplanes 14. Alternatively, in backplanes, which principally stem from digital electronics, digital components are used to handle the effects of cross talk. These components can take up a significant amount of backplane real estate, be unnecessarily costly and produce heat. Secondly, with respect to telephone lines, backplanes are etched printed circuits, thereby eliminating the freedom of movement that enables telephone lines to be twisted. Occasionally, a return line may be added externally to a backplane, but no twisting (field cancellation) occurs.

The substantial intricacies of providing shielding and twisted pairs in an etched backplane have not been tackled in the prior art. They form the basis of the present application.

SUMMARY OF THE INVENTION

Accordingly, it is the object of the present invention to provide a backplane having shielded signal lines.

It is another object of the present invention to provide a backplane having signal lines that are twisted in pairs with respect to one another.

It is still another object of the present invention to provide reliable high speed data communication in a backplane.

The attainment of these and related objects are achieved through use of the novel twisted pair backplane herein disclosed. A twisted pair backplane in accordance with this invention has a backplane having a layer of insulation material, a plurality of lead segments arranged in line and spaced from one another on a first surface of the insulation material, a plurality of cooperating lead segments arranged in line and spaced from one another on a second surface of the insulation material, and connectors for interconnecting the ends of alternate segments on the first and second surfaces to form a first continuous line alternating between lead segments on the first and second surfaces. Connectors are also provided for connecting the ends of alternate segments on the first and second surfaces to form a second continuous line separate from the first line, the second line alternating between lead segments on the first and second surfaces and rotating axially about the first line with respect to the first line such that the first and second lines produce a twisted pair in the backplane.

The attainment of the foregoing and related objects, advantages and features of the invention should be more readily apparent to those skilled in the art, after review of the following more detailed description of the invention, taken together with the drawings, in which:

DESCRIPTION OF THE PREFERRED EMBODIMENT

Reference will now be made in detail to the preferred embodiments of the invention, examples of which are illustrated in the accompanying drawings. While the invention will be described in conjunction with the preferred embodiments, it will be understood that it is not intended to limit the invention to those embodiments. On the contrary, the invention is intended to cover alternatives, modifications and equivalents, which may be included within the spirit and scope of the invention as defined by the appended claims.

Figure 1B:
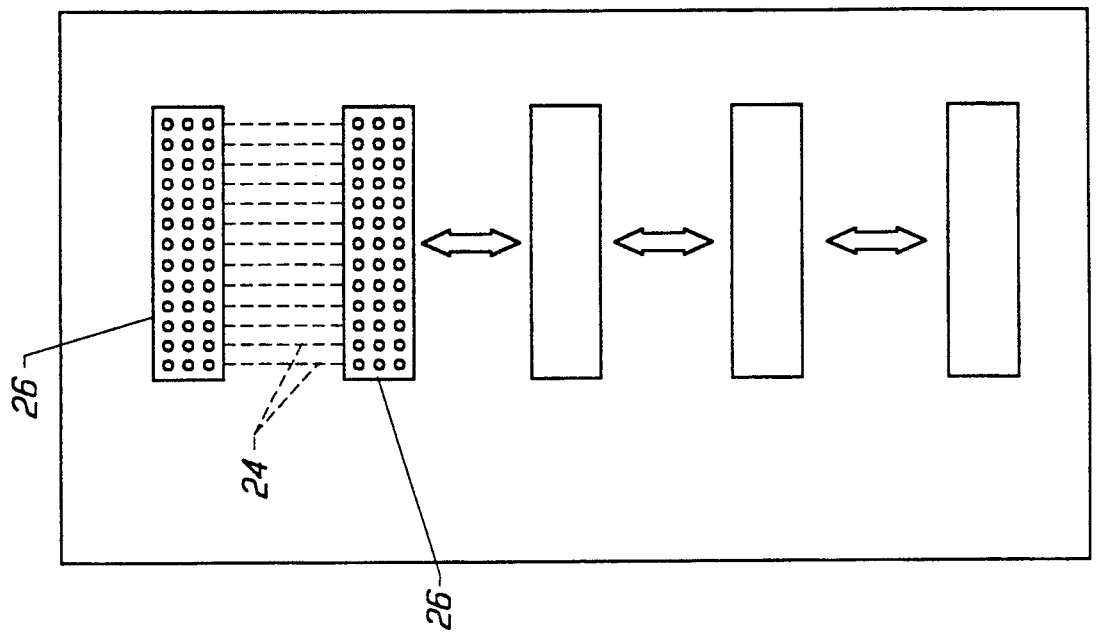
FIGS. 1a and 1b illustrate a backplane arrangement of the prior art.
Figure 1A:
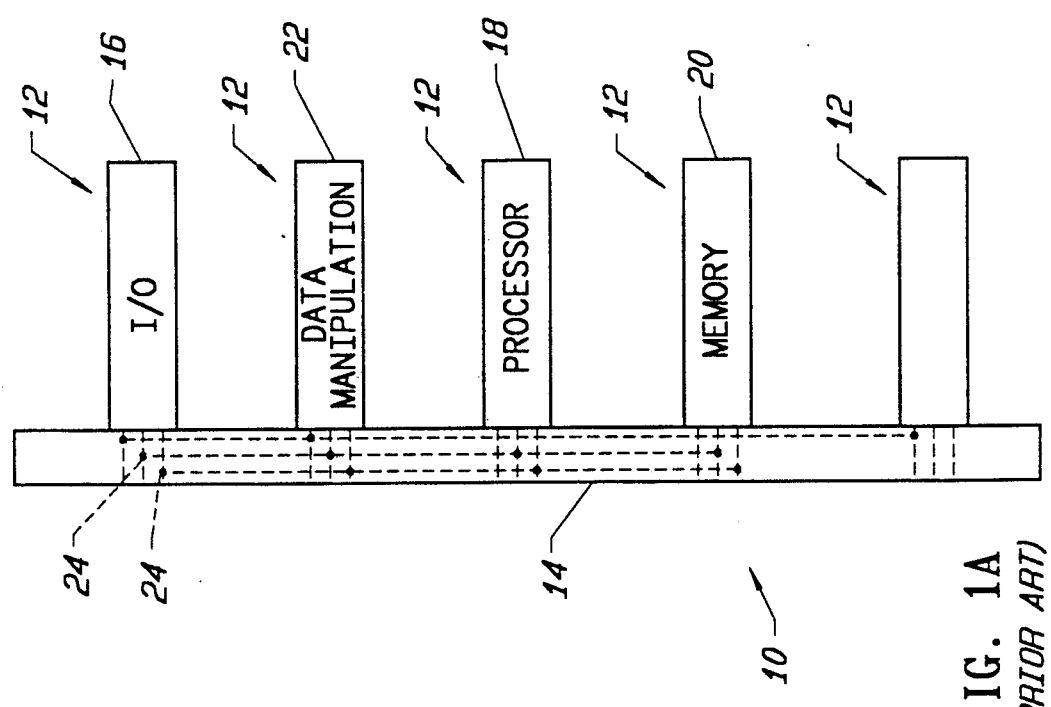
Figure 2:
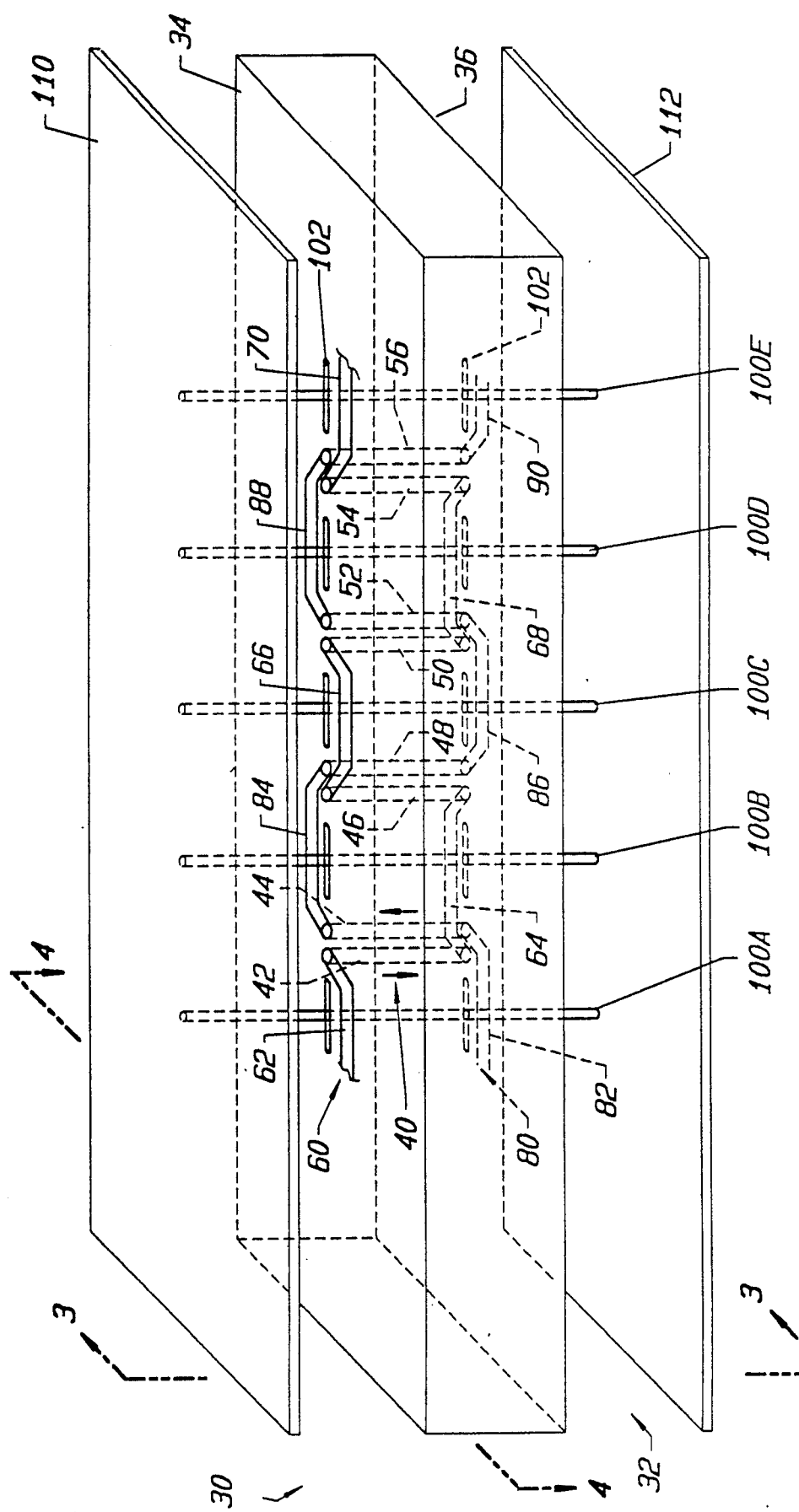
FIGS. 2 is a perspective view of a twisted pair backplane in accordance with the preferred embodiment.

Referring to FIG. 2, a perspective view of the twisted pair backplane of the preferred embodiment is shown. The Figure illustrates only an isolated twisted pair 40 to demonstrate how the two signal lines which form the pair are configured within the backplane 30.

As discussed in the prior art, a twisted pair is comprised of a signal line and a return line. The concept of twisted pairs and signal and return lines is well known in the art. In the preferred embodiment, a piece of insulation material, which may form a board 32, is used to separate the pair 40. The pair 40 is formed by lead segments on a top surface 34 of the board 32, by lead segments on a bottom surface 36 of the board 32 and by interconnecting lead segments ("interconnectors") 42-56 (even only). The lead segments and interconnectors 42-56 (even only) are made of copper or some other highly conductive material. More particularly, the assembly may be in the form of a printed circuit board having leads which are formed by and interconnections which can be formed by plating.

The designation of a signal and return line in the pair is arbitrary. For purposes of this description, the signal line 60 will be designated as starting on the top surface 34 of the board and the return line 80 will be designated as starting on the bottom surface 36 of the board. A first segment 62 of the signal line 60 is situated on the board 32. The first segment 62 is connected by interconnector 42 to a second segment 64 on the bottom surface 36. The second segment 64 is then connected by interconnector 46 to a third segment 66 on the top surface 34. The signal line 60 continues to move through the etched backplane 30. The segment is connected to a fourth segment 68 by interconnector 50. And the fourth segment 68 is connected to a fifth segment 70 by interconnector 54. From this pattern it is clear that the signal line is configured to alternate between the top and bottom surfaces of the board. Accordingly, any signal on the signal line will propagate from the top to bottom surfaces and vice versa.

The return line 80 is configured in much the same way as the signal line. The return line, however, is on the bottom surface when the signal line is on the top surface and vice versa. Also, the return line weaves around the signal line, or more accurately stated, the signal line and return line rotate about one another from the perspective of a longitudinal axis in the direction of signal propagation stretching from left to right across the figure.

A first lead segment 82 of the return line is situated on the bottom of the board 32. In order to connect the return line 80 to the top surface 34, the first segment 82 is connected by interconnector 44 to a second segment 84. A signal on the signal line 60 propagates to the bottom surface while a signal on the return line propagates from the bottom to the top surface as indicated by the arrows adjacent interconnectors 42 and 44. At the first pair of interconnectors 42 and 44, or actually, shortly thereafter, the return line 80 crosses over the signal line 60. Alternatively stated, the signal line 60 crosses underneath the signal line 80.

The second segment 84 of the return line 80 then connects through interconnector 48 to a third segment 86. At the second set of interconnectors 46 and 48, the return line crosses underneath the signal line 60, or alternatively stated, the signal line 60 passes over the return line 80. The actual crossing takes place just past the second set of interconnectors 46 and 48 at the third segments 66 and 86 of the respective lines 60 and 80.

The third segment 86 of the return line 80 is on the bottom surface 36 of the board 32. In order to connect the return line 80 back to the top surface 34, the third segment 86 is connected by interconnector 52 to a fourth segment 88 on the surface 34. The fourth segment is in turn connected by interconnector 56 to a fifth segment 90. The fifth segment 90 is on the bottom surface 36 of the board 32.

At the third pair of interconnectors 50 and 52 the return line 80 passes over the signal line 60. Alternatively stated, the signal line passes underneath the return line 80. At the fourth pair of interconnectors 54 and 56 the return line 80 passes under the signal line 60 while the signal line 60 simultaneously crosses over the return line 80.

A plurality of conduction layers or shield layers serving as ground layers, a top layer 110 and a bottom layer 112, (shown in FIG. 3) are provided. The conduction layers are connected by connecting rods 100A-100E which extend through the board 32. In order to provide shielding from neighboring signal lines, a plurality of shielding leads 102 are provided (to avoid making the figure too busy, not all of the shielding leads are numbered). These shielding leads 102 are discussed in more detail with reference to FIG. 4. Furthermore, note that in FIG. 2 only an isolated twisted pair is illustrated (for purposes of clarity of the figure and illustrating the twist). In the actual preferred embodiment there are several adjacent twisted pairs. The shielding leads are located between the adjacent pairs (as shown in FIG. 4) to shield each one from its neighbor.

Figure 3:
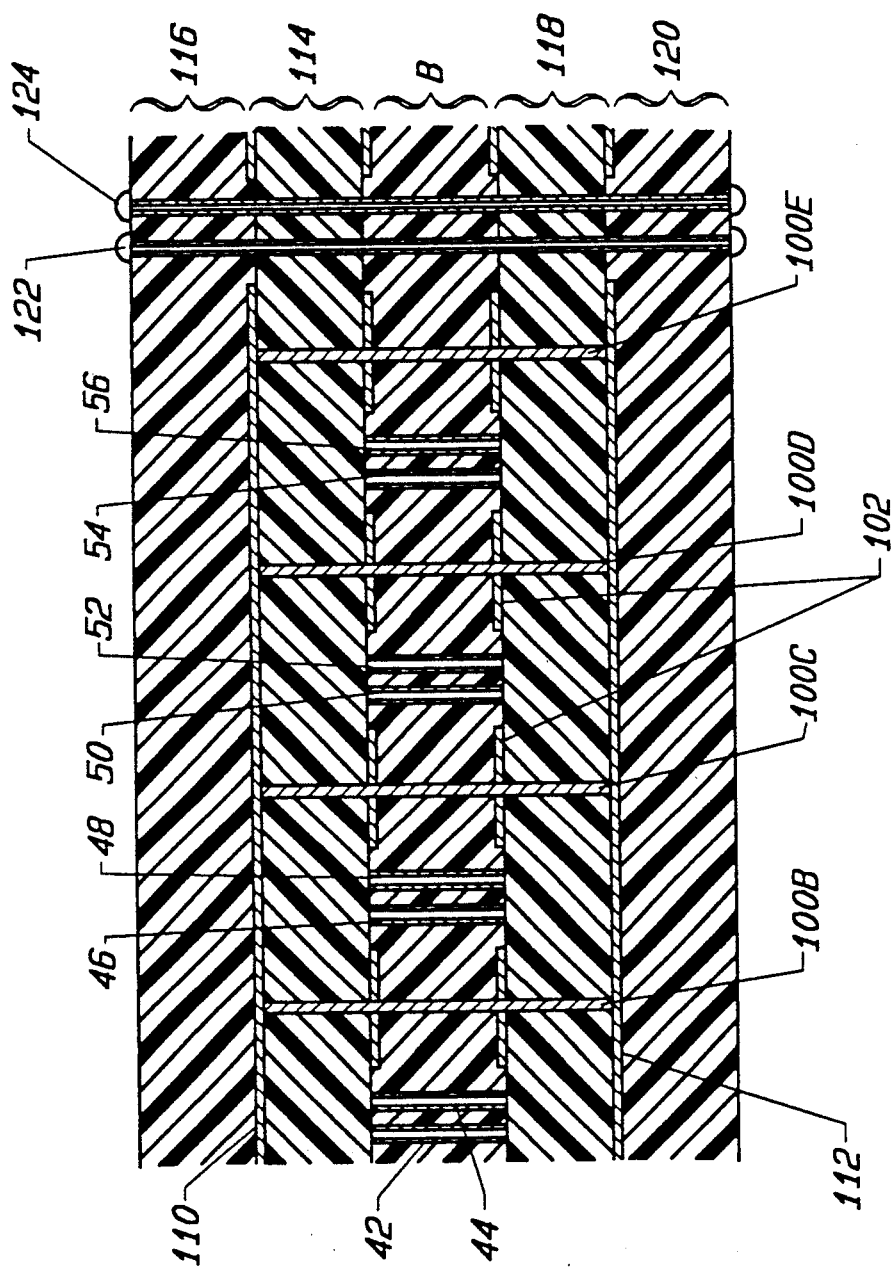
FIG. 3 is a sectional view of the preferred embodiment of FIG. 2 along line 3—3 with the addition of shield layers, further insulation layers, and a signal line connector.
Figure 4:
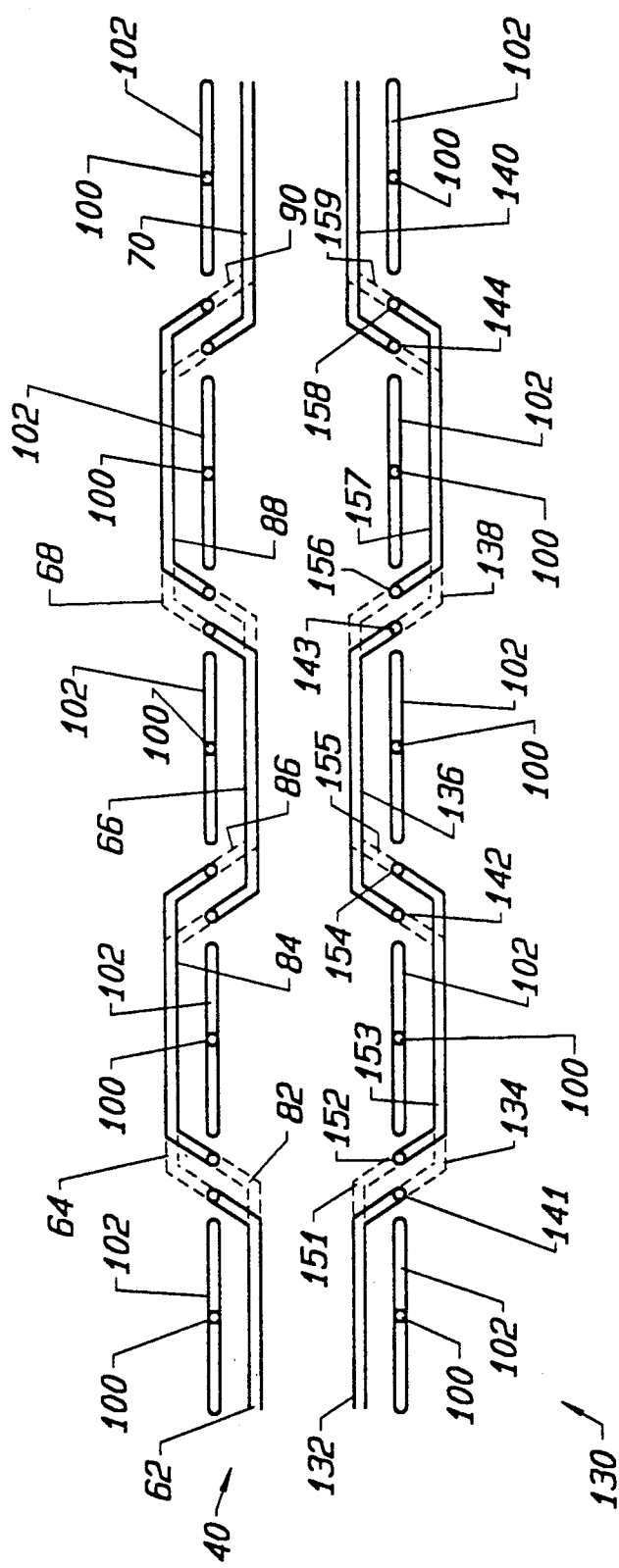
FIG. 4 is plan view illustrating neighboring signal line pairs from the perspective of line 4—4.

Referring to FIG. 3, a cut-away view of the back plane of FIG. 2 is shown from the perspective of line 3—3. A few additional components and layers are shown. These additional aspects will be described below. In this cross-sectional view the interconnectors 42-56 (even only) appear as short parallel rods. The lead segments which make up the signal and return line are not shown because they are either above the plane of the page, under the plane of the page or passing through the plane of the page at the top and bottom portions (with respect to FIG. 3) of the interconnectors 42-56 (even only). Note that each interconnector is illustrated having two parallel segments. This is because in the fabrication process holes are drilled for the interconnectors through the insulation material and then metal is deposited on the inside of the bored holes. As such, the interconnectors are each conducting cylinders. In cross-section a cylinder appears as two parallel segments.

As in FIG. 2, the pairs of interconnectors 42-56 (even only) are located adjacent a plurality of connecting rods 100B-100E, one connecting rod between each pair. Shielding leads 102 extend form connecting rods 100B-100E. Included in FIG. 3 are the conduction layers 110 and 112. Conduction layers are generally known in the art. The conduction layers 110 and 112 lie in planes parallel to the top surface 34 and the bottom surface 36 of the board 32. The board 32 is indicated in FIG. 3 as being that block of material inside designation B. Designated areas 114-120 (even only) additional layers of insulation. FR4 is a common insulation, but several others are well known and may be used.

To access the twisted pair 40 within the backplane 30, connector leads 122 and 124 ar Ⓡused. The lines of a twisted pair terminate at connector leads 122 and 124 in the same manner as they connect to an interconnector 42-56 (even only).

Referring to FIG. 4, a view of the preferred embodiment is presented from the perspective of line 4—4 in FIG. 2. In addition to twisted pair 40, a second twisted pair 130 is shown. The significance of the additional twisted pair 130 is to demonstrate that when a second twisted pair 130 is located adjacent twisted pair 40 it twists in a direction opposite of that of twisted pair 40. Twisted pair 130 is a mirror image of twisted pair 40. The segments 62-70 (even only) which make up of twisted pair 40 serve the same function as segments 132-140 (even only) of twisted pair 130. A plurality of interconnectors 141-144 connect the individual lead segments 132-140 (even only) back and forth between a top and bottom surface of material (shown as board 32 in FIG. 2).

The lead segments 82-90 (even only) of the return line of the twisted pair 40 serve the same function as lead segments 151-159 (odd only) of twisted pair 130. Interconnectors 152-158 (even only) connect the individual lead segments 151-159 (odd only) back and forth between a top and bottom surface of insulation material (again, shown as board 32 in FIG. 2). A plurality of shielding leads 102 are provided (as in FIGS. 2 and 3) to perform some degree of shielding between adjacent twisted pairs, e.g., twisted pairs 40 and 130. The shielding capabilities of shielding leads 102 stem from their connection to ground by connection to the connecting rods 100 which are connected to ground.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A backplane comprising:
    a layer of insulation material;
    a plurality of lead segments arranged in line and spaced from one another on a first surface of said insulation material;
    a plurality of cooperating lead segments arranged in line and spaced from one another on a second surface of said insulation material;
    means for interconnecting the ends of a first portion of alternate segments on said first and second surfaces to form a first continuous line alternating between lead segments on said first and second surfaces;
    means for connecting the ends of a second portion of alternate segments on said first and second surfaces to form a second continuous line alternating between lead segments on said first and second surfaces separate from said first continuous line; said first and second continuous lines twisting along the axis of signal propagation to produce a twisted pair within said backplane;
    a plurality of conductive shield layers located parallel with and adjacent to said first and second surfaces of the layer of insulation material;
    a plurality of connecting rods connecting said plurality of shield layers through said insulation material; and
    said shield layers being ground layers, said first and second continuous lines being internal thereto, said shield layers shielding said first and second continuous lines on two opposing sides.

2. The apparatus of claim 1 wherein said plurality of connecting rods are dispersed through said insulation material in proximity to said first and second continuous lines;
    said connecting rods having conductive member extending therefrom for providing shielding above and below said first and second continuous lines so that a coaxial environment is created for said first and second continuous lines.

3. The apparatus of claim 1 wherein said first continuous line and said second continuous line are twisted axially with respect to one another to form said twisted pair such that said first and second continuous lines of said twisted pair move from alternate surfaces of said insulation material in a radially circular fashion, said twisted first and second continuous crossing lines over one another at predefined intervals.

4. The apparatus of claim 3 further comprising:
    a plurality of twisted pairs of first and second continuous lines located adjacent one another, each adjacent twisted pair having an opposite, but equal unidirectional twist to that of an adjacent pair so that inductive couplings between adjacent twisted pairs substantially cancel one another.

5. A twisted pair backplane having a plurality of conduction layers, etch layers and insulation layers, said insulation layers separating said conduction and said etch layers, comprising:
    a plurality of signal leads located on each of said plurality of etch layers for transmitting signals in said backplane;
    a plurality of connecting leads placed at specific intervals through at least one of said insulation layers for connecting said signal leads from one of said plurality of etch layers to the signal leads of another of said plurality of etch layers;
    said signal leads and said plurality of connecting leads forming a plurality of twisted signal and return line pairs, each of said twisted signal and return line pairs being formed by said connecting leads connecting specific ones of said signal leads through at least one of said insulation layers such that each of said twisted signal and return line pairs is twisted unidirectionally in said backplane;

a plurality of connecting rods dispersed through said etch layers forming a contact between said plurality of conduction layers;

said conduction layers shielding said twisted signal and return line pairs on two opposing sides; and said connecting rods having conductive member extending therefrom for providing shielding above and below said twisted signal and return line pairs so that a coaxial environment is created for said twisted signal and return line pairs.

6. The apparatus of claim 5 wherein said plurality of twisted signal and return line pairs are located adjacent to one another, and adjacent twisted signal and return line pairs twist in directions opposite to one another to cancel inductive coupling therebetween.

* * * * *